(12) United States Patent
Brown et al.

(10) Patent No.: US 8,977,531 B1
(45) Date of Patent: *Mar. 10, 2015

(54) APPARATUS AND METHODS FOR IMPORTING HARDWARE DESIGN AND GENERATING CIRCUIT INTERFACES

(71) Applicant: Altera Corporation, San Jose, CA (US)

(72) Inventors: James M. Brown, San Jose, CA (US); Tim Allen, San Jose, CA (US); Mike Fairman, San Jose, CA (US); Jeffrey O. Pritchard, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/072,223

(22) Filed: Nov. 5, 2013

Related U.S. Application Data

(63) Continuation of application No. 13/538,232, filed on Jun. 29, 2012, now Pat. No. 8,606,558, which is a continuation of application No. 13/022,919, filed on Feb. 8, 2011, now Pat. No. 8,234,101, which is a continuation of application No. 11/839,398, filed on Aug. 15, 2007, now Pat. No. 7,890,317, which is a continuation of application No. 10/393,220, filed on Mar. 20, 2003, now Pat. No. 7,272,546.

(60) Provisional application No. 60/441,460, filed on Jan. 21, 2003.

(51) Int. Cl.
*G06F 17/50* (2006.01)

(52) U.S. Cl.
CPC .................................. *G06F 17/5077* (2013.01)
USPC .............. 703/13; 703/22; 714/738; 717/106; 717/135

(58) Field of Classification Search
CPC .................. G06F 17/5045; G06F 17/5054
USPC ................ 703/13, 22; 717/106, 135; 714/738
See application file for complete search history.

(56) References Cited

U.S. PATENT DOCUMENTS

| | | |
|---|---|---|
| 5,841,663 A | 11/1998 | Sharma et al. |
| 6,237,007 B1 | 5/2001 | Brown |
| 6,401,230 B1 | 6/2002 | Ahanessians et al. |
| 6,453,448 B1 | 9/2002 | Meyer |
| 6,487,709 B1 | 11/2002 | Keller et al. |
| 6,539,536 B1 | 3/2003 | Singh et al. |
| 6,725,441 B1 | 4/2004 | Keller et al. |
| 6,856,950 B1 | 2/2005 | Abts et al. |
| 6,976,239 B1 | 12/2005 | Allen et al. |
| 7,272,546 B1 | 9/2007 | Brown et al. |

(Continued)

OTHER PUBLICATIONS

Altera, Max+Plus II, "Programmable Logic Development System & Software", Data Sheet, Ver. 8, Jan. 1998, 21 pages.

(Continued)

*Primary Examiner* — Thai Phan
(74) *Attorney, Agent, or Firm* — Weaver Austin Villeneuve & Sampson LLP

(57) ABSTRACT

A system for designing a circuit, which includes a module, uses a computer. A user may program or adapt the computer to perform computer-aided design functions. The computer obtains a description of the module from the user. The computer parses the description of the module to identify a port of the module, and to obtain information about the port. The computer presents to the user the information that it has obtained about the port.

20 Claims, 5 Drawing Sheets

(56) References Cited

U.S. PATENT DOCUMENTS

| | | |
|---|---|---|
| 7,890,317 B2 | 2/2011 | Brown et al. |
| 8,234,101 B1 | 7/2012 | Brown et al. |
| 8,606,558 B1 | 12/2013 | Brown et al. |
| 2002/0183997 A1 | 12/2002 | Powell et al. |
| 2004/0154002 A1 | 8/2004 | Ball et al. |

OTHER PUBLICATIONS

Altera, "SOPC Builder", Data Sheet, Ver. 6, May 1999, pp. 1-16.
Altera, "Introduction", Data Sheet, Ver. 6, May 1999, 20 pages.
Cadence, "Cadence Signal Processing Worksystem", Data Sheet, 12 pages.
U.S. Office Action dated Mar. 21, 2006 from U.S. Appl. No. 10/393,220.
U.S. Office Action dated Sep. 22, 2006 from U.S. Appl. No. 10/393,220.
U.S. Notice of Allowance dated Apr. 30, 2007 from U.S. Appl. No. 10/393,220.
U.S. Supplemental Notice of Allowance dated Jul. 26, 2007 from U.S. Appl. No. 10/393,220.
U.S. Office Action dated Apr. 1, 2010 from U.S. Appl. No. 11/839,398.
U.S. Notice of Allowance and Allowability dated Sep. 29, 2010 from U.S. Appl. No. 11/839,398.
U.S. Office Action Response to 312 Amendment dated Nov. 17, 2010 from U.S. Appl. No. 11/839,398.
U.S. Office Action dated Aug. 8, 2011 from U.S. Appl. No. 13/022,919.
U.S. Notice of Allowance and Allowability dated Apr. 13, 2012 from U.S. Appl. No. 13/022,919.
U.S. Office Action dated Dec. 13, 2012 from U.S. Appl. No. 13/538,232.
U.S. Notice of Allowance and Allowability dated Aug. 5, 2013 from U.S. Appl. No. 13/538,232.

APPARATUS AND METHODS FOR IMPORTING HARDWARE DESIGN AND GENERATING CIRCUIT INTERFACES

CROSS-REFERENCE TO RELATED APPLICATIONS

This patent application is a continuation of and claims priority, under 35 U.S.C. §120, to co-pending U.S. patent application Ser. No. 13/538,232, filed Jun. 29, 2012, and titled "APPARATUS AND METHODS FOR IMPORTING HARDWARE DESIGN AND GENERATING CIRCUIT INTERFACES", which is hereby incorporated by reference in its entirety. U.S. patent application Ser. No. 13/538,232, is a continuation and claims priority, under 35 U.S.C. §120, to U.S. patent application Ser. No. 13/022,919, filed Feb. 8, 2011, now U.S. Pat. No. 8,234,101, issued Jul. 31, 2012, and titled "APPARATUS AND METHODS FOR IMPORTING HARDWARE DESIGN AND GENERATING CIRCUIT INTERFACES", which is hereby incorporated by reference in its entirety. U.S. patent application Ser. No. 13/022,919 is a continuation of and claims priority, under 35 U.S.C. §120, to U.S. patent application Ser. No. 11/839,398, filed Aug. 15, 2007, now U.S. Pat. No. 7,890,317, issued Feb. 15, 2011, and titled "APPARATUS AND METHODS FOR IMPORTING HARDWARE DESIGN AND GENERATING CIRCUIT INTERFACES", which is hereby incorporated by reference in its entirety. U.S. patent application Ser. No. 11/839,398 is a continuation of and claims priority, under 35 U.S.C. §120, to U.S. patent application Ser. No. 10/393,220, filed Mar. 20, 2003, now U.S. Pat. No. 7,272,546, issued Sep. 18, 2007, and titled "APPARATUS AND METHODS FOR IMPORTING HARDWARE DESIGN AND GENERATING CIRCUIT INTERFACES", which is hereby incorporated by reference in its entirety. U.S. patent application Ser. No. 10/393,220 claims the benefit, under 35 U.S.C. §119(e), of U.S. Provisional Patent Application No. 60/441,460, filed Jan. 21, 2003, and titled "APPARATUS AND METHODS FOR IMPORTING HARDWARE DESIGN AND GENERATING CIRCUIT INTERFACES", which is hereby incorporated by reference in its entirety.

TECHNICAL FIELD

This patent application relates generally to generating logic circuitry and programmable logic devices (PLDs) and, more particularly, to importing hardware designs and generating interfaces in PLDs and systems on a programmable chip (SOPC).

BACKGROUND

PLDs have increasingly proliferated in many areas of technology, such as data processing and signal processing applications. The inherent flexibility of PLDs and the user's ability to re-configure them have in part led to their popularity. System designers and even system end-users can program the PLDs and re-configure the functionality of part or all of the system. Re-configuring the system avoids costly and time-consuming re-design of the system or its various components or sub-systems.

Configuring a PLD typically involves providing configuration data to the PLD. The configuration data program the PLD to implement a wide variety of user-defined functions, ranging from standalone logic functions to SOPC. The user-defined functions may include blocks of hardware that perform particular functions. Generating the configuration data therefore entails incorporating user-defined hardware description into the SOPC description, and implementing the user-defined hardware in the PLD by generating appropriate interfaces to the user-defined hardware.

Conventional design tools typically require the user to manually intervene in the design process to comprehend the hardware description, often provided in one or more hardware description language (HDL) files, to generate the appropriate interfaces. This manual process introduces inefficiency and susceptibility to errors into the design of the SOPC or the final desired circuitry.

SUMMARY

This invention relates to importing hardware designs and generating appropriate hardware interfaces to those designs in desired circuitry or SOPC implemented using one or more PLDs. One aspect of the invention relates to systems for computer-aided design of a circuit that includes a module. In one embodiment, a system according to the invention includes a computer. The computer obtains a description of the module, and parses the description of the module to identify a port of the module. The computer also obtains information about the port, and presents the port information to the user.

Another aspect of the invention relates to computer-program products for computer-aided design of a circuit that includes a module. In one embodiment, a computer program product according to the invention includes a computer application that a computer may access. The computer application causes the computer to obtain a description of the module, parse the description, identify a port of the module, and obtain information about the port. The computer application also causes the computer to present the port information to the user.

Yet another aspect of the invention concerns methods for computer-aided design of a circuit that includes a module. The method includes obtaining a description of the module, parsing the description by using a computer to identify a port of the module and to obtain information about the port. The method also includes presenting information about the port to the user.

DESCRIPTION OF THE DRAWINGS

The appended drawings illustrate only exemplary embodiments of the invention and therefore should not be considered as limiting its scope. The disclosed inventive concepts lend themselves to other equally effective embodiments. In the drawings, the same numeral designators used in more than one drawing denote the same, similar, or equivalent functionality, components, or blocks.

DETAILED DESCRIPTION

Figure 1:
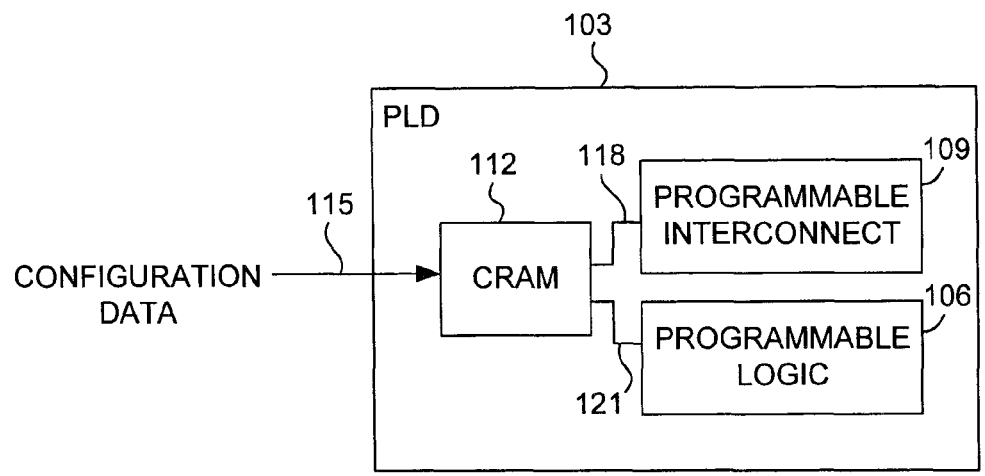
FIG. 1 shows a block diagram of a PLD suitable for implementing desired circuitry or SOPC designed according to the invention.

This invention contemplates apparatus and methods for importing hardware designs and generating appropriate hardware interfaces to those designs in desired circuitry or SOPC implemented using one or more PLDs. The inventive concepts disclosed here overcome the problems associated with conventional tools.

Conventional tools fail to include to provide a way to seamlessly and automatically couple custom user logic circuitry to a variety of desired bus (or connector or communication medium) types with minimal effort and user intervention. Conventional tools treat each port of an imported user design as an individual connector that requires a connection. For example, rather than recognizing a standard bus, conventional tools treat it as a collection of connectors that each has its own individual connection, rather than acting as part of an overall bus. Furthermore, conventional tools fail to gather or provide information that would allow the automatic coupling of the ports to a particular bus or communication medium.

The inventive concepts in part include using a GUI. The GUI includes a number of graphical features, such as check boxes, buttons, windows, and the like, which allow the user to interact with the GUI. The GUI helps to automate the process of importing hardware design (through HDL files or other description medium or database) and generating appropriate interfaces to the hardware. As a result, the user may couple the designs or custom logic to a wide variety of buses, connectors, and/or communication media with minimal effort and intervention. The designs or custom logic may correspond to desired or specified blocks or sub-systems or, generally, modules.

Using the GUI, the user may couple the custom designs seamlessly into an overall design, system, or SOPC with minimal intervention. The end-user has a relatively large amount of control over the interface between the user's custom logic and the generated design or SOPC. The user, however, need not have any detailed knowledge of the underlying hardware, the bus specifications, and the interface generation technology. A model of that information (e.g., hardware, bus specifications, and the like) drives the GUI. Thus, much of the validation of the interface may occur at the data-entry phase instead of through the lengthy generation, synthesis, and place-and-route processes.

In an illustrative embodiment, the GUI in a computer-aided design (CAD) tool according to the invention allows the user to provide a list of HDL design files and parameters associated with a hardware design, such as a top-level module that includes the user-provided logic circuitry. A parser scans and analyzes the HDL files, identifies the ports, and extracts port information for the top-level module. This information resides in a GUI table. The tool automatically assigns bus types or roles to the ports based on a desired or prescribed naming convention. The user may assign any unassigned types or roles. The tool uses the information to create an interface specification stored in the SOPC description database used to generate configuration data for one or more PLDs that implement the overall desired circuitry, system, or SOPC.

FIG. 1 shows a block diagram of a PLD 103 suitable for implementing desired circuitry, system, or SOPC according to the invention. PLD 103 includes programmable logic 106 and programmable interconnect 109. Note that PLD 103 may include other arrangements and numbers of programmable logic 106 and programmable interconnect 109, as desired. For example, interconnect 109 may include a plurality of interconnect segments that in turn couple to one another.

Programmable logic 106 may include a variety of configurable logic, such as gates, look-up tables (LUT), multiplexers (MUX), etc., as desired. Generally, programmable logic 106 may also include other circuitry (not shown explicitly), such as product term circuitry and memory. PLD 103 may include blocks of memory known by various names in the art, such as embedded system block (ESB), as desired. The blocks of memory may couple to programmable logic 106 and may reside within programmable logic 106, as desired.

Programmable interconnect 109 couples the various blocks of programmable logic 106 to one another and to other circuitry (not shown explicitly) outside PLD 103, as desired. Circuitry within PLD 103 (e.g., programmable logic 106 or programmable interconnect 109) may communicate with circuitry external to PLD 103 via input/output (I/O) circuitry (not shown explicitly).

PLD 103 also includes configuration memory (CRAM) 112. CRAM 112 receives configuration data 115. Based on configuration data 115, CRAM 112 provides control signals 118 and control signals 121 to programmable interconnect 109 and programmable logic 106, respectively. Control signals 118 determine the functionality of programmable interconnect 109 (i.e., in what manner programmable interconnect 109 couples the various blocks and parts of PLD 103 to one another). Similarly, control signals 121 determine the functionality of programmable logic 106. Thus, through configuration data 115, the user can control and program the overall functionality of PLD 103.

Figure 2:
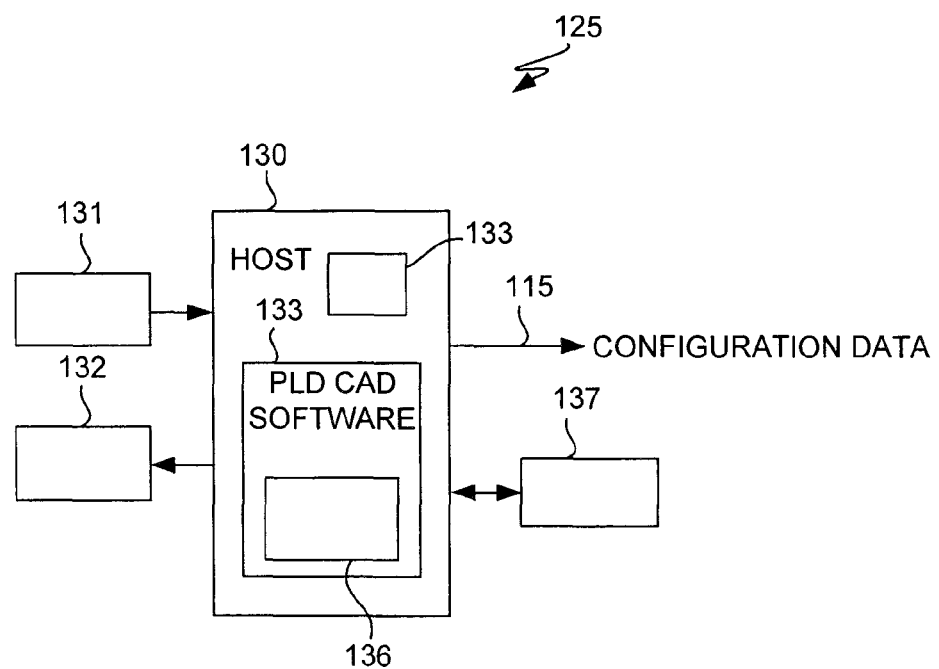
FIG. 2 illustrates a circuit arrangement according to the invention for providing configuration data to a PLD.

PLD 103 typically receives configuration data 115 from an external source. FIG. 2 illustrates a circuit arrangement 125 according to the invention for generating and providing configuration data 115 to one or more PLDs, such as PLD 103 in FIG. 1. Circuit arrangement 125 in FIG. 2 may provide configuration data 115 to the PLD directly or through an intermediate device, such as a memory or other storage device, as desired.

Circuit arrangement 125 includes host 130 that responds to PLD CAD software 133. Host 130 may constitute a personal computer, a workstation, general-purpose computer, or other type of data-processing device, as desired. Host 130 receives user input from one or more input devices 131 (such as keyboard, mouse, etc.), and provides output to the user via one or more output devices 132 (such as display, monitor, printer, plotter, etc.). PLD CAD software 133 may run on one or more processors that reside in host 130.

Instructions or program code (and data, as applicable) included within PLD CAD software 133, cause host 130 to perform the functionality programmed or coded in PLD CAD software 133, including the functionality of design importer and interface generator 136, described below in detail. Put another way, PLD CAD software 133 defines the functionality of host 130 insofar as host 130 performs the functions coded or programmed within PLD CAD software 133.

PLD CAD software 133 may reside (e.g., be stored or coded) on or within computer-readable medium 137. Computer-readable medium 137 may constitute a storage device, such as diskette, CD-R, CD-ROM, DVD, hard disk, semiconductor memory or disk device, etc., as persons of ordinary skill in the art with the benefit of the description of the invention understand. In such a situation, host 130 may either run PLD CAD software 133 from computer-readable medium 137, or from a copy stored in host 130 (for example, in memory, on a hard drive, or both). PLD CAD software 133 (or a copy of it) may reside within host 130 (for example, on a hard drive, in memory, a combination of the two, or other arrangement), as desired. As persons of ordinary skill in the art with the benefit of the description of the invention understand, one may use other arrangements of host 130, and PLD CAD software 133 and computer-readable medium 137, as desired. As one example, one may run PLD CAD software 133 via a computer network that includes computer-readable medium 137.

PLD CAD 133 software at least in part provides functionality for design-entry, synthesis, place-and-route, and verification of desired circuitry, an overall system, or SOPC implemented using one or more PLDs. In one illustrative embodiment according to the invention, PLD CAD software 133 may constitute the Quartus® II software supplied by Altera Corporation, the assignee of this patent application.

PLD CAD software 133 includes design importer and interface generator 136. Using design importer and interface generator 136, host 130 allows the user to import hardware designs via HDL files and to generate appropriate interfaces to those designs, as described below in further detail.

Figure 3:
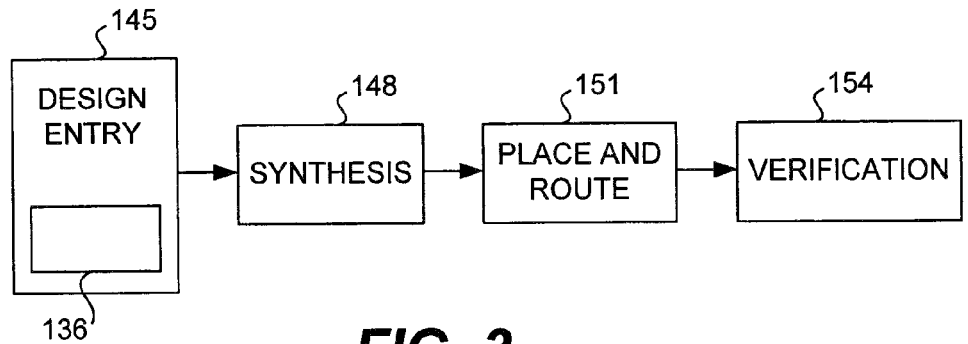
FIG. 3 depicts various software modules that a PLD CAD software according to one embodiment of the invention uses to accomplish its tasks.

PLD CAD software 133 may use designated software modules to accomplish its tasks. FIG. 3 depicts various software modules that PLD CAD software 133 according to one embodiment of the invention uses. The modules include design-entry module 145, synthesis module 148, place-and-route module 151, and verification module 154.

Design-entry module 145 allows the integration of multiple design files. The user may generate the design files by using design-entry module 145 or by using a variety of electronic design automation (EDA) or CAD tools (such as industry-standard EDA tools), as desired. The user may enter the design in a graphic format, a waveform-based format, a schematic format, in a text format, or as a combination of those formats, as desired.

Design importer and interface generator 136 allows the user to import HDL-based designs and to generate desired interfaces to those designs automatically and without manual user intervention. Furthermore, design importer and interface generator 136 allows the user to specify a design without using HDL files, as desired, and as described below in more detail. Design importer and interface generator 136 may at least in part reside within design-entry module 145. Because design importer and interface generator 136 operates on some outputs of design-entry module 145 (for example, to generate appropriate interfaces), design importer and interface generator may constitute a separate block or module from design-entry module 145, as desired.

Design-entry module 145 may support a variety of formats for accepting design files from the user or from a third party vendor or design provider, as desired. For example, design-entry module 145 may support HDL formats such as Very High Speed Integrated Circuit (VHSIC) Hardware Description Language (VHDL), Electronic Data Interchange Format (EDIF), and Verilog HDL text and graphical based design entry methods. In addition, design-entry module 145 may support other formats, as desired, as persons of ordinary skill in the art who have the benefit of the description of the invention understand.

Furthermore, design-entry module 145 may support combining a variety of HDL formats in the same design project, as desired. Design-entry module 145 may include a block design editor (not shown explicitly in FIG. 2). Using the block design editor, the user can edit top-level design information in graphical format. The user can also use design-entry module 145 to convert the top-level design information to a desired HDL, such as VHDL or Verilog, for use in various synthesis and simulation flows, such as third-party synthesis and simulation flows.

Synthesis module 148 accepts the output of design-entry module 145. Based on the user-provided design, synthesis module 148 generates appropriate logic circuitry that realizes the user-provided design. As noted above, one or more PLDs (not shown explicitly) implement the synthesized overall design, system, or SOPC.

Synthesis module 148 may also generate any glue logic that allows integration and proper operation and interfacing of various modules in the user's designs. For example, synthesis module 148 provides appropriate hardware so that an output of one block properly interfaces with an input of another block. Synthesis module 148 may provide appropriate hardware so as to meet the specifications of each of the modules in the overall design, system, or SOPC.

Furthermore, synthesis module 148 may include algorithms and routines for optimizing the synthesized design, as desired. Through optimization, synthesis module 148 seeks to more efficiently use the resources of the one or more PLDs that implement the overall design, system, or SOPC. Synthesis module 148 provides its output to place-and-route module 151.

Place-and-route module 151 uses the designer's timing specifications to perform optimal logic mapping and placement. The logic mapping and placement determine the use of routing resources within the PLD(s). In other words, by use of particular programmable interconnects with the PLD(s) for certain parts of the design, place-and-route module 151 helps optimize the performance of the overall design, system, or SOPC. By proper use of PLD routing resources, place-and-route module 151 helps to meet the critical timing paths of the overall design, system, or SOPC. Place-and-route module 151 optimizes the critical timing paths to help provides timing closure faster. As a result, the overall design, system, or SOPC can achieve faster performance (i.e., operate at a higher clock rate or have higher throughput). Place-and-route module 151 provides the optimized design to verification module 154.

Verification module 154 performs simulation and verification of the design. The simulation and verification seek in part to verify that the design complies with the user's prescribed specifications. The simulation and verification also aim at detecting and correcting any design problems before prototyping the design. Thus, verification module 154 helps the user to reduce the overall cost and time-to-market of the overall design, system, or SOPC.

Verification module 154 may support and perform a variety of verification and simulation options, as desired. The options may include design-rule checking, functional verification, test-bench generation, static timing analysis, timing simulation, hardware/software simulation, in-system verification, board-level timing analysis, signal integrity analysis and electro-magnetic compatibility (EMC), formal netlist verification, and power-consumption estimation, as desired. Note that one may perform other or additional verification techniques as desired and as persons of ordinary skill in the art who have the benefit of the description of the invention understand.

Figure 4:
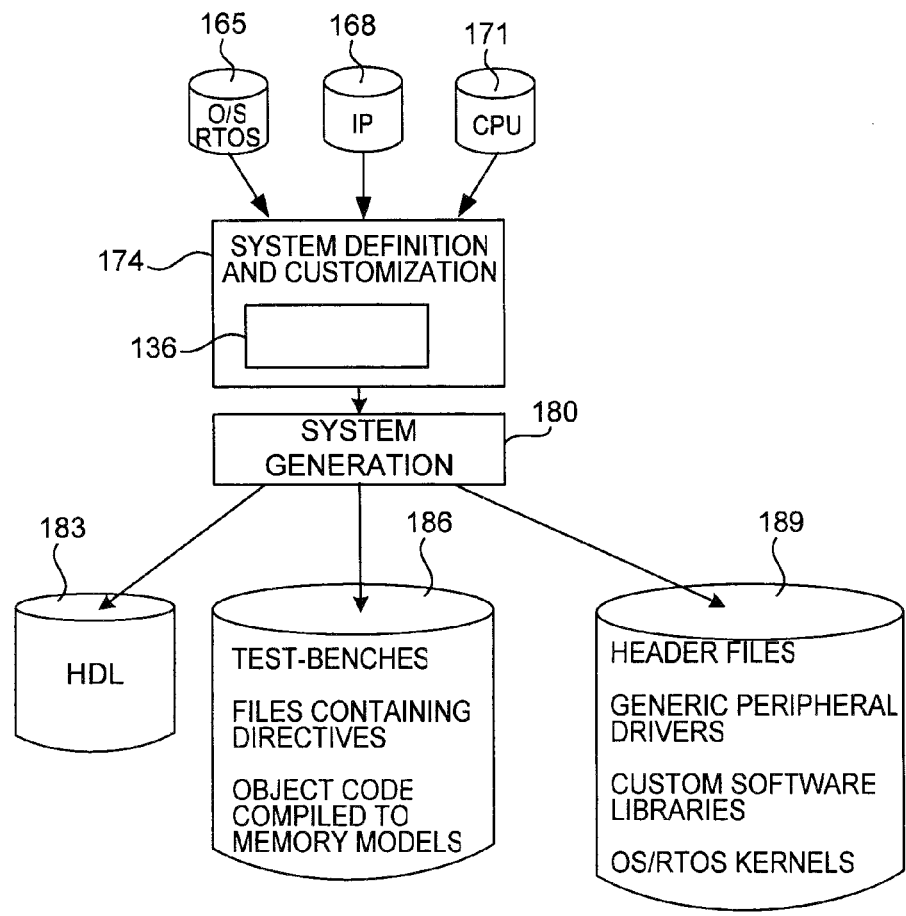
FIG. 4 shows a block diagram that provides more details of an illustrative embodiment of a PLD CAD software tool according to the invention.

FIG. 4 shows a block diagram that provides more details of parts of the design entry and synthesis modules in an illustrative embodiment of a PLD CAD software tool according to the invention. One may use such a PLD CAD software tool to automatically generate an SOPC based on the user's specifications and existing module designs (e.g., custom or specified designs).

A system definition and customization module, indicated generally at 174, accepts definitions and descriptions for various user-selected and user-specified modules. In an illustrative embodiment, the user may use a GUI interface to list and arrange SOPC components and to communicate his or her choices to system definition and customization module 174. Within the GUI, each component may itself provide another GUI to the user for its own configuration.

To define and customize the SOPC, the user may select some components from an intellectual property (IP) database 168. IP database 168 may provide components supplied by the user, by the PLD supplier, or by third-party suppliers, as desired. IP database 168 may include input files in desired formats for a variety of components, blocks, sub-systems, and peripherals. For example, IP database 168 may include digital filters, logic components and blocks, universal asynchronous receiver-transmitter (UART), memory interfaces, communications peripherals, buses and interfaces, digital signal processing (DSP) cores, and the like. As persons of ordinary skill in the art who have the benefit of the invention understand, depending on such factors as the design and performance specifications of the SOPC, one may include virtually any desired component, core, block, and/or peripheral in IP database 168.

IP database 168 may also include user-provided HDL definitions for hardware blocks that the user may desired to use in the SOPC. System definition and customization module 174 uses design importer and interface generator 136 to import HDL descriptions of various user-specified blocks and to generate appropriate interfaces to those blocks.

System definition and customization module 174 allows the user to specify one or more central processing unit (CPU) or a general processing core from CPU database 171. The CPU(s) integrate as part of the SOPC and provide generalized processing functions. CPU database 171 includes appropriate description and definition files for a variety of CPUs or processing cores, as desired.

System definition and customization module 174 also accepts inputs from operating system/real-time operating system (OS/RTOS) database 165. Using OS/RTOS database 165, the user may specify desired operating systems that run on one or more CPUs selected from CPU database 171. OS/RTOS database 165 includes description and definition files and associated modules for a variety of operating systems and real-time operating systems, as desired.

System definition and customization module 174 provides its output to system generation module 180 in the form of one or more system description files. System generation module 180 generally performs similar tasks as does synthesis module 148 (see FIG. 3). System generation module 180 generates descriptions of the appropriate hardware to realize the SOPC according to the user's specifications. System generation module 180 also generates appropriate glue logic to interface to one another the various blocks of hardware in the SOPC.

As one of its outputs, system generation module 180 provides HDL database 183. HDL database 183 may include SOPC synthesis files VHDL, Verilog, or other desired HDL formats. Using HDL database 183, one may synthesize or generate the SOPC.

Also as its output, system generation module 180 provides verification database 186 and software database 189. Verification database 186 includes files used for verification and simulation of the SOPC. The files include test-benches, files containing directives, and modules for compiled object code models (compiled and linked software programs specified by the user at the design-entry phase as part of the information stored in a simulation model).

Software database 189 provides miscellaneous software files used for proper operation of software, such as the OS or RTOS, that the SOPC may use. The files in software database 189 include header files, generic peripheral drivers (for example, drivers for input and output devices coupled to the SOPC), custom software libraries, and files related to the OS/RTOS, such as the kernels.

Note that the databases shown in FIG. 4 include files and modules for an exemplary embodiment according to the invention. Depending on the application and the design and performance specifications, one may include fewer or more or different types of databases/files, as desired. The choice of the type and number of the databases, files, and modules fall within the knowledge of persons skilled in the art who have the benefit of the description of the invention.

Figure 5:
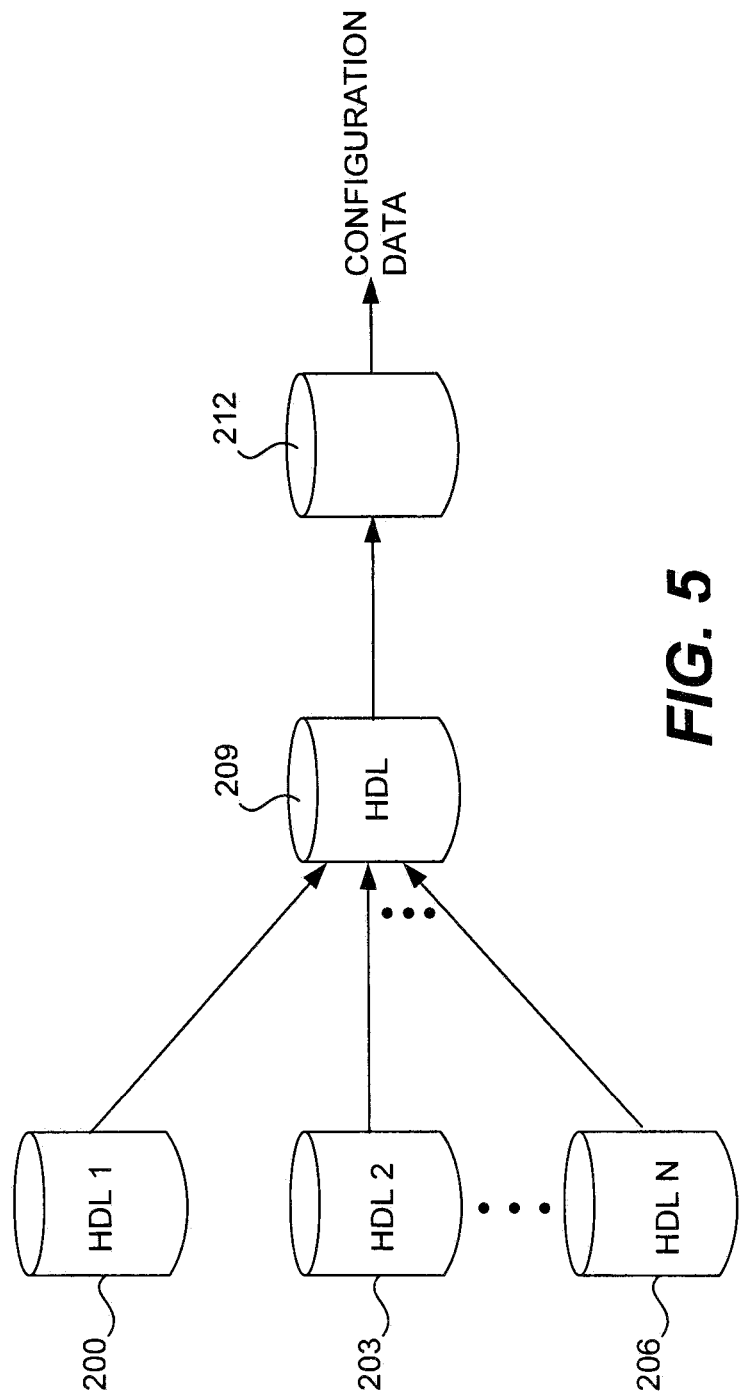
FIG. 5 illustrates importing files from HDL databases and generating an overall HDL database in an illustrative embodiment according to the invention.

As noted above, design importer and interface generator 136 allows the user to import hardware designs via HDL files and to generate appropriate interfaces to those designs and blocks. The imported designs may correspond to blocks, designs, or sub-systems or, generally, modules. The imported designs often reside in several HDL files. Design importer and interface generator 136 imports those files and processes them to generate a database that includes the imported designs. FIG. 5 illustrates further details of importing files from HDL databases and generating an overall HDL database in an illustrative embodiment according to the invention.

Various designs, whether supplied by the user, the PLD vendor, or third parties, reside in a plurality of databases, indicated as HDL database 200, HDL database 203, and HDL database 206. Each of HDL database 200, HDL database 203, and HDL database 206 may include a disparate module, such as a UART, memory controller, etc. Generally, each of HDL database 200, HDL database 203, and HDL database 206 may include a module that constitutes a part of the overall SOPC.

The user specifies (as described below in more detail) the HDL databases to design importer and interface generator 136. Design importer and interface generator 136 imports the relevant HDL files for each design from a respective one of HDL database 200, HDL database 203, and HDL database 206. Design importer and interface generator 136 then analyzes the HDL files and establishes and generates appropriate interfaces to each of the imported designs.

Once it has generated those interfaces, design importer and interface generator 136 generates one or more output files for inclusion in HDL database 209. The output files in HDL database 209 include at least one HDL file that provides a description of the overall design, system, or SOPC. As noted above, the files within HDL databases 200-206 and output HDL database 209 may use any desired HDL format, for example VHDL, EDIF, or Verilog, as persons of ordinary skill in the art with the benefit of the description of the invention understand.

PLD CAD software 133 uses the files in HDL database 209 to generate system description files. PLD CAD software 133 includes the system description files in database 212. The system description files include information that PLD CAD software 133 uses to generate the configuration data that it provides to the PLD(s) that implement the user's overall design, system, or SOPC. Based on the interfaces that design importer and interface generator 136 provides, the various design blocks (as specified via HDL databases 200-206) communicate and interface with one another, as appropriate to the user's overall design or SOPC.

As noted above, design importer and interface generator 136 imports, and generates appropriates interfaces to, the modules (or blocks, designs, or sub-systems) in each of HDL databases 200-206. Once it has imported the module from an HDL database, design importer and interface generator 136 parses and analyzes the HDL file corresponding to the module. As it parses the HDL file, design importer and interface generator 136 detects or determines the various ports (and their characteristics, as described below) that exist in the module. Based on its parsing of the HDL file and the detected ports, design importer and interface generator 136 establishes and generates appropriate interfaces to those ports.

Figure 6:
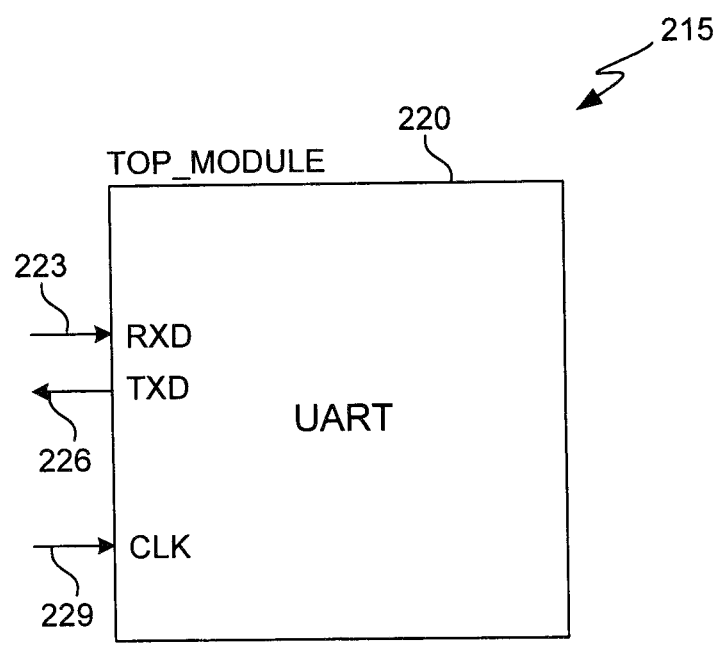
FIG. 6 depicts an example of a sub-system processed by software according to an illustrative embodiment of the invention.

FIG. 6 depicts an example of a sub-system 215 processed by design importer and interface generator 136 according to an illustrative embodiment of the invention. Sub-system 215 includes a simplified block diagram of UART 220. UART 220 includes three ports: data-receive (RXD) port 223, data-transmit (TXD) port 226, and clock port 229. Data-receive port 223 allows UART 220 to receive data signals from an external source, while data-transmit port 226 provides the capability for UART 220 to send data to an external destination. Clock port 229 receives a clock signal that may coordinate the timing of data reception and transmission operations, as well other internal functions of UART 220.

The HDL description of UART 220 may reside in an HDL file named TOP_MODULE, which may in turn reside in an HDL database, say, one of HDL databases 200-206 (see FIG. 5). The HDL file TOP_MODULE includes descriptions of data-receive port 223, data-transmit port 226, and clock port 229, as persons of ordinary skill in the art with the benefit of the description of the invention understand.

By parsing the HDL file for module, design importer and interface generator 136 determines various characteristics of each port described in the HDL file, such as its name, direction, and width, and the like, as described below. For example, referring to UART 220, design importer and interface generator 136 may parse HDL file TOP_MODULE and determine the following information about its ports:

TABLE 1

| Port Name | Width | Direction | Type |
|---|---|---|---|
| RXD | 1 | Input | data |
| TXD | 1 | Output | data |
| CLK | 1 | Input | clock |

As persons of ordinary skill in the art who have the benefit of the description of the invention understand, design importer and interface generator 136 may determine a wide variety of information about the ports of a module. In addition to, or instead of, the information shown in Table 1 above, one may determine other information as desired, for example whether a port constitutes a shared port, etc., as desired.

Although the above description of FIG. 5 and the associated information in Table 1 relate to a UART, one may use similar techniques with respect to other types of module (or block, design, sub-system), as desired. In other words, by parsing HDL files associated with specified modules, one may determine information about the ports of those modules, as persons of ordinary skill in the art who have the benefit of the description of the invention understand.

Furthermore, note that the port types and names in Table 1 constitute an illustration of the data that design importer and interface generator 136 may determine about a particular module. As persons skilled in the art with the benefit of the description of the invention understand, one may use a variety of naming conventions, as desired. The particular names, types, etc., depend on factors such as the naming conventions in a particular HDL, the names and types associated with the buses used, and the like, as persons of ordinary skill in the art with the benefit of the description of the invention appreciate. Thus, design importer and interface generator 136 provides a flexible way of determining information about the ports of a module.

Figure 7:
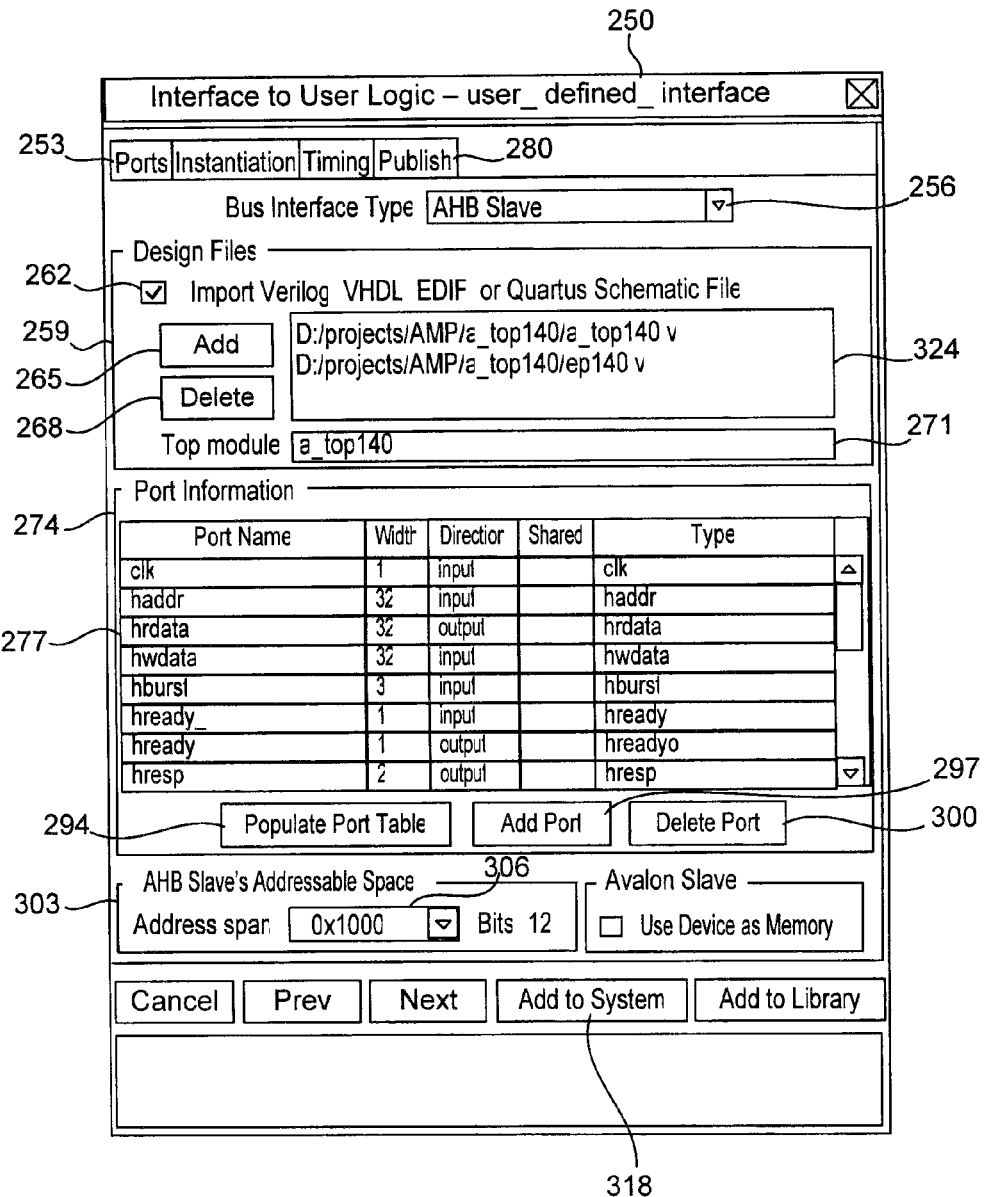
FIG. 7 shows an illustrative embodiment of a graphical user-interface (GUI) according to the invention.

As noted above, one may use a GUI as part of design importer and interface generator 136. FIG. 7 shows an illustrative embodiment of a GUI 250 according to the invention. GUI 250 has a number of elements with which the user may interact to provide information to design importer and interface generator 136, and to receive information regarding the HDL files, ports, interfaces, and the like, as described below in detail.

Towards its top portion, GUI 250 has a number of tabs, generally indicated at 253. The tabs allow the user to invoke various functions, such as automatic port detection and interface generation, instantiation, and the like. By clicking the "Ports" tab in GUI 250, the user may invoke HDL file importation, automatic port detection, and interface generation. Note that, depending on design and performance specifications for a particular implementation, one may use different tabs that denote different functionality, as desired.

Below tabs 253, GUI 250 includes a drop-down menu 256. Drop-down menu 256 allows the user to select the type of bus interface. In other words, the user may use drop-down menu 256 to select the type of bus to which the user's module interfaces. In illustrative embodiments according to the invention, drop-down menu 256 may provide the user with the choice of a number of general-purpose or custom bus types or communication mechanisms, as desired. For example, the user may select from Avalon or Advanced High-performance Bus (AHB) bus types. As persons of ordinary skill in the art with the benefit of the description of the invention understand, one may include a wide variety of bus types in drop-down menu 256, as desired.

Furthermore, one may configure GUI 250 to work with various buses in a number of ways, as desired. For example, one may make the bus types and associated information hard-coded within the software itself (i.e., the program code for GUI 250). Alternatively, one may use a file or a number of files (e.g., a database) that include descriptions and related information for one or more bus types. GUI 250 may read those files to determine the structures and information that it uses to support those bus types. Thus, GUI 250, and design importer and interface generator 136 generally, provide a flexible way of supporting a variety of desired bus types.

GUI 250 also includes a design-file dialog interface generally indicated at 259. Design-file dialog interface 259 allows the user to specify the HDL files that describe various modules (or blocks, designs, sub-systems). By using checkbox 262 of GUI 250, the user may cause design importer and interface generator 136 to import prescribed HDL file types. In the embodiment shown, the prescribed HDL file types include Verilog, VHDL, EDIF, and Quartus® files and associated formats.

GUI 250 includes design-file window 324. GUI 250 uses design-file window 324 to present the list of the design files to the user. In the embodiment shown in FIG. 7, design-file window 324 presents information about each file's path, its name, and its extension. As persons of ordinary skill in the art with the benefit of the description of the invention recognize, however, one may include a variety of data and information about the design files, as desired, such as, date of creation or modification, file type, and the like.

Design-file dialog interface 259 includes Add button 265 and Delete button 268. Once design-file dialog interface 259 has presented the design files to the user via design-file window 324, the user may choose to add other files by clicking (via a mouse or keyboard shortcuts) on Add button 265. Doing so presents the user with a dialog (via an interface such as a GUI) that allows the user to add the files. The user may repeat those steps to provide additional files. The user may also remove a file listed in design-file window 324 by selecting the file (for example, by clicking on the filename), and then clicking on Delete button 268. The user may repeat this procedure to remove additional files, as desired.

As part of design-file dialog interface 259, GUI 250 further includes top-module window 271. Top-module window 271 indicates the name of the top module corresponding to the module for which the user wishes to extract port information and generate interfaces. In one embodiment according to the invention, top-module window 271 indicates the name of the first file listed in design-file window 324. In other words, the name of the top module shown in top-module window 271 defaults to the name of the first file listed in design-file window 324.

As persons of ordinary skill in the art with the benefit of the description of the invention recognize, however, one may use a multitude of ways to specify the top module. For example, one may use the instantiation hierarchy in an HDL file. As another example, one may use heuristics to examine an HDL file and select a top-module name. As yet another example, the user may specify a top-module name. The user may do so in a variety of ways, for example, by placing a cursor within top-module window 271 (e.g., by pointing a mouse pointer within top-module window 271 and clicking a mouse button) and typing the name of a desired top module.

GUI 250 further includes a port-information window, generally indicated at 274. Through port-information window 274, the user can automatically obtain information about the ports in input HDL files, and add and delete ports manually.

Port-information window 274 includes a populate port-table button 294. The user may activate populate port-table 294 by using the keyboard or clicking a mouse button. When the user does so, design importer and interface generator 136 scans and parses the HDL files listed in design-file dialog interface 259 to extract port information. Design importer and interface generator 136 parses each module in each HDL file to determine its name. If the name matches the name of the top module in top-module window 271, then design importer and interface generator 136 extracts information on each input/output (I/O) port of that module. The extracted information may include a wide variety and type of characteristics, information, and data about the ports, as described below in more detail.

If the name of none of the modules matches the prescribed name of the top module, design importer and interface generator 136 may take various actions, such as providing a likely name for the top module, generating an error message, taking corrective or remedial actions, or both, as desired. For example, design importer and interface generator 136 may attempt to deduce (e.g., by using heuristics) the likely name of the top module and present that candidate name to the user, or proceed without user input. As an alternative, design importer and interface generator 136 may try to determine the name of the top module by examining the comments included in the HDL files. As another option, it may present the modules it has found in the HDL files and give the user an opportunity to select a top module among them. As yet another alternative, design importer and interface generator 136 may seek input and intervention from the user (for example, by generating an error message).

By parsing the HDL content corresponding to the top module, design importer and interface generator 136 determines information about each port and presents the information to the user in a suitable form, such as table 277, via port-information window 274. Through table 277, design importer and interface generator 136 may present a variety of information about the bus or conductor or line at each port, for example, port name, width, direction, shared status, and type. For recognized bus types, rather than treating the bus signals as individual connectors, design importer and interface generator 136 recognizes and treats them as a bus.

The port name denotes the name of the port as specified the HDL file. Port width signifies the number of bus conductors or lines for the port. Port direction indicates the direction of flow of information for the port (e.g., input, output, bi-directional). The shared field denotes whether the port constitutes a shared port. Port type indicates the type (or role) of the port or signal as provided in the bus specifications corresponding to the particular bus interface specified (through drop-down menu 256 or other means, such as an input field, as desired). As an example, as shown in FIG. 7, with respect to the AHB Slave bus specified by the user, port name "clk" has a width of 1, is an input port, is not shared, and has the type "clk" (which signifies a clock in the bus specifications).

Note that design importer and interface generator 136 may determine other parameters (as specified in the corresponding HDL files) about various ports, as desired, and present them to the user via port-information window 274. For example, design importer and interface generator 136 may provide information regarding timing parameters, electrical parameters, and/or other parameters, as persons of ordinary skill in the art who have the benefit of the description of the invention understand.

Furthermore, design importer and interface generator 136 may provide an opportunity for the user to specify various parameters for a port, as desired. For example, the user may select a desired port (or a field or property for that port), activate an interface (such as a GUI), and specify the desired parameter(s). Generally, the user may edit the information table 277 (or other presentation mechanism) directly, as desired, for example, by clicking on an entry to either modify its value or to activate a drop-down menu, etc., as artisans with the benefit of the description of the invention understand.

Design importer and interface generator 136 may encounter a port type that does not correspond to a supported port type in the prescribed bus specifications (for example, an unassigned type or role). In such a circumstance, design importer and interface generator leaves the corresponding entry in table 277 blank, and allows the user to specify a port type. The user may click on the type field for the particular port to input the port type or select the port type from a drop-down menu (or through other suitable methods), as desired. The drop-down menu may provide a general list of possible types, or it may provide a subset of the general list based on the characteristics of the particular port. For example, the drop-down menu may present to the user port types whose width and direction match that of the particular port in table 277.

By way of illustration, suppose that a module includes an output port that does not constitute part of the prescribed bus (e.g., the AHB bus). Design importer and interface generator 136 may present to the user port type "export" (to denote the direction of data flow), which the user may select. The user may provide particular characteristics of the port (e.g., electrical, timing), as desired.

As an alternative, design importer and interface generator 136 may attempt to determine the port type automatically and without user intervention by, for example, parsing information in comments embedded in HDL files, by using heuristics, by using less-restrictive port naming conventions, and/or by using deduction based on some or all of the available information. For example, if the port has a width greater than one and its direction identifies it as an input port, design importer and interface generator 136 may deduce that the port constitutes a read data port. As another alternative, design importer and interface generator 136 may examine the logic functionality (corresponding to the desired logic circuitry of a module) described in the corresponding HDL file to deduce the type of port.

The user may also add one or more ports to the ports listed by design importer and interface generator 136, as desired. The user may do so by activating add-port button 297. Doing so presents the user with a GUI (or other desired interface) that allows the user to specify various information and parameters for the particular port. The added port may correspond to a port that the user uses to interface to a block or device external to the overall design, system, or SOPC, and the like. Furthermore, the user may delete one or more ports, as desired. The user may do so by selecting the port (for example, by clicking on its name), and then activating delete-port button 300.

Depending on the selected or prescribed bus interface type (e.g., AHB, Avalon), the user may specify bus parameters, such as timing parameters, address spaces, and the like, as desired. Referring to FIG. 7, interface parameter window 303 allows the user to specify such parameters. In the example shown in FIG. 7, the user may specify the address for an AHB slave bus. As another example, the user may specify parameters for an Avalon slave bus. In other embodiments according to the invention, one may specify fewer, more, and/or different parameters for the same or other buses, as desired. Generally, as persons of ordinary skill in the art with the benefit of the description of the invention understand, one may specify a wide variety of parameters for various buses, as desired.

GUI 250 also includes add-to-system button 318, which allows the user to add the top module and its associated interfaces to the overall design, system, or SOPC in the form of one or more system description files. In addition, the user may save the files corresponding to the modules and their associated interfaces by activating publish tab 280. By doing so, the user has the option of later accessing the added design for use in the future. Note that the system description files may use any suitable desired database format, as persons of ordinary skill in the art with the benefit of the description of the invention understand.

Note that the user may specify an external device or module (to the PLD) to which the user wishes to establishes interfaces, as desired. In such a situation, rather than specifying HDL files, the user may specify the ports for such an external device or module manually. To do so, the user may specify the external device or module by adding the appropriate ports with desired characteristics (width, direction, timing, and electrical characteristics, etc.). Design importer and interface generator 136 establishes interfaces with the external device or module based on the user's specifications.

As part of generating the overall design, system, or SOPC, PLD CAD software 133 according to the invention may generate or specify appropriate coupling of various ports to provide the desired interfaces by specifying suitable connections. PLD CAD software 133 may also determine and generate or specify logic circuitry (in the format of a desired description language or HDL) that allows various modules to interface to one another in order to meet specified parameters. PLD CAD software 133 may do so by reading the description files to determine the various parameters for the system or SOPC modules and to determine the additional circuitry that matches the parameters for modules that interface to each other. The generated logic circuitry allows the matching of electrical specifications (e.g., logic levels), time specifications, or other parameters of the modules, as desired. Thus, using the generated logic circuitry, the user may seamlessly couple together modules that conform to various standards or methodologies in order to generate a flexible overall design, system, or SOPC.

As an example, suppose that a processor drives a UART through a port. Suppose further that the processor generates logic low signals, but that the UART accepts logic-high signals. PLD CAD software 133 recognizes the type of output and input signals for the processor and UART modules and automatically generates appropriate circuitry (inverters, in this example) that properly couples the processor to the UART. As persons of ordinary skill in the art who have the benefit of the invention understand, one may generally apply this concept to a wide variety of designs in order to facilitate the interfacing of various modules.

The description of the invention above refers to GUI 250, as shown in FIG. 7. As persons of ordinary skill in the art with the benefit of the description of the invention understand, however, one may use a wide variety of other GUIs, as desired. Such interfaces may include different, more, or fewer features or graphical elements (e.g., check boxes, radio buttons, drop-down menus, tabs, input boxes, windows, buttons, etc.). Furthermore, alternative GUIs may have similar or dissimilar look-and-feel, as desired, and still provide the functionality described here. As merely one example, one may use a GUI in the form of a schematic-capture system where each graphical block represents a module, and where each signal in a port of that module has various items of information (e.g., direction, type) associated with it. The user may examine and manipulate the information about each port of each module by interacting with the graphical block representation of that module. In addition, rather than using GUIs, one may use alternative interfaces, such as text-based interfaces, as desired.

Referring to the figures, the various blocks shown depict mainly the conceptual functions and signal or information flow. The actual implementation may or may not contain separately identifiable hardware or software for the various functional blocks. For example, one may combine the functionality of various blocks into one block (or module), as desired. Furthermore, one may realize the functionality of a single block in several blocks, as desired. The choice of implementation depends on various factors, such as particular design and performance specifications for a given implementation, as persons of ordinary skill in the art with the benefit of the description of the invention will understand.

Other modifications and alternative embodiments of the invention in addition to those described here will be apparent to persons of ordinary skill in the art who have the benefit of the description of the invention. Accordingly, this description teaches those skilled in the art the manner of carrying out the invention and are to be construed as illustrative only. The forms of the invention shown and described should be taken as the presently preferred embodiments. Persons skilled in the art may make various changes in the shape, size and arrangement of parts without departing from the scope of the invention described in this document. For example, persons skilled in the art may substitute equivalent elements for the elements illustrated and described here. Moreover, persons skilled in the art who have the benefit of this description of the invention may use certain features of the invention independently of the use of other features, without departing from the scope of the invention.

We claim:

1. A system for computer-aided design of a programmable logic circuit including a module, the system comprising:
    means for obtaining a description of the module;
    means for parsing the description of the module to identify a port of the module and to obtain information about the port;
    a computer adapted to present to a user the information about the port and to obtain from said user a name of a bus for interfacing the bus to the module, said bus being available in said programmable logic circuit; and
    means for generating an interface between said bus and the module based on the information obtained about the port.

2. The system according to claim 1, wherein the computer is further adapted to use a graphical user-interface to present to the user the information about the port.

3. The system according to claim 1, further comprising means for obtaining information about one or more of a name, width, direction, and type of the port.

4. The system according to claim 1, wherein the computer is further adapted to use a graphical user-interface to interact with the user to manipulate the information about the port.

5. The system according to claim 1, wherein generating the interface further comprises generating a description file corresponding to the interface.

6. The system according to claim 5, further comprising means for:
    using the description file corresponding to the interface to implement the interface in a programmable logic device (PLD); and
    using said description file that includes the description of the module to implement the module in the programmable logic device.

7. The system according to claim 1, further comprising means for:
    identifying a top module corresponding to the module;
    wherein the computer is further adapted to:
    use a user graphical-interface to present the top module to the user.

8. The system according to claim 1, wherein the computer is further adapted to obtain from the user at least one parameter of a bus via a graphical user-interface.

9. The system according to claim 1, wherein the computer is further adapted to use a graphical user-interface to allow the user to modify the information about the port.

10. The system according to claim 9, wherein the description file corresponding to the interface comprises a hardware description language (HDL) file.

11. The system according to claim 1, wherein the description of the module comprises a hardware description language (HDL) file.

12. The system of claim 1, further including means for:
    determining that the user has chosen to publish the module; and
    allowing later access of the module for use in future designs.

13. A system for computer-aided design of a circuit including a module, the system comprising:
    means for obtaining a description of the module and a name of a bus for interfacing the bus to the module;
    means for parsing the description of the module to identify a port of the module and to obtain information about the port; and
    a computer adapted to generate an interface between the bus and the module based on the information obtained about the port.

14. The system of claim 13, wherein the description of the module and the name of the bus is obtained from a user and the computer is adapted to present to the user the information obtained about the port.

15. The system of claim 13, further comprising means for assigning a bus type to the port based on a desired or prescribed naming convention.

16. The system of claim 13, further comprising means for obtaining information about one or more of a name, width, direction, and type of the port.

17. The system of claim 13, wherein generating the interface further comprises generating a description file corresponding to the interface.

18. The system of claim 17, further comprising means for:
    using the description file corresponding to the interface to implement the interface in a programmable logic device (PLD); and
    using said description file that includes the description of the module to implement the module in the PLD.

19. The system of claim 17, wherein one or both of the description file corresponding to the interface and the description of the module comprises a hardware description language (HDL) file.

20. The system of claim 13, wherein the computer is configured to determine that the user has chosen to publish the module and allow later access of the module for use in future designs.

* * * * *